United States Patent [19]

Houtteman et al.

[11] Patent Number: 5,145,408

[45] Date of Patent: Sep. 8, 1992

[54] CONNECTOR FOR SOLDERLESS ATTACHMENT TO A PRINTED CIRCUIT BOARD

[75] Inventors: Bernard Houtteman, Oostkamp; Michel Mussen, Gent, both of Belgium

[73] Assignee: Siemens Aktiengesellschaft, Munich, Fed. Rep. of Germany

[21] Appl. No.: 824,753

[22] Filed: Jan. 17, 1992

Related U.S. Application Data

[63] Continuation-in-part of Ser. No. 543,380, Jun. 15, 1990, abandoned.

[30] Foreign Application Priority Data

Jun. 26, 1989 [DE] Fed. Rep. of Germany ... 8907785[U]

[51] Int. Cl.$^5$ ............................................. H01R 13/00
[52] U.S. Cl. .................................... 439/581; 439/80
[58] Field of Search ................. 439/80, 81, 84, 581

[56] References Cited

U.S. PATENT DOCUMENTS

| | | | |
|---|---|---|---|
| 4,191,440 | 3/1980 | Schramm | 339/17 C |
| 4,453,796 | 6/1984 | Monroe | 439/581 |
| 4,494,816 | 1/1985 | Tamburro | 439/581 |
| 4,684,200 | 8/1987 | Capp | 439/84 |
| 4,718,854 | 1/1988 | Capp et al. | 439/581 |
| 4,737,114 | 4/1988 | Yaegashi | 439/82 |
| 4,749,357 | 6/1988 | Foley | 439/80 |
| 4,824,380 | 4/1989 | Matthews | 439/80 |
| 4,836,791 | 6/1989 | Grabbe et al. | 439/81 |

FOREIGN PATENT DOCUMENTS 8027565 5/1981 Fed. Rep. of Germany.
8118274 10/1981 Fed. Rep. of Germany.
8806100 11/1988 Fed. Rep. of Germany.

Primary Examiner—Joseph H. McGlynn
Attorney, Agent, or Firm—Hill, Van Santen, Steadman & Simpson

[57] ABSTRACT

A connector for connection to a printed circuit board comprising a connector body and at least one conductor pin extending from the connector body. The conductor pin has a nail shaped region engaging a bore of the connector body and a press-in zone for engaging walls of a bore disposed in the printed circuit board to establish a solderless electrical and mechanical connection between the connector body and the printed circuit board.

4 Claims, 1 Drawing Sheet

CONNECTOR FOR SOLDERLESS ATTACHMENT TO A PRINTED CIRCUIT BOARD

This is a continuation-in-part, of application Ser. No. 543,380, filed Jun. 15, 1990, now abandoned.

BACKGROUND OF THE INVENTION

The present invention is directed to a connector for solderless attachment to a printed circuit board. The principles of the invention are applied with respect to high current contacts and coaxial connector halves.

A coaxial connector half is shown, for example, in German Gerbrauchsmuster DE 80 27 565 U1. The coaxial connector half described therein utilizes inner connector and outer connector housings having pins which can be plugged into the bores of a printed circuit board. After the pins have been plugged in they are soldered in the bores to connect the connector half to the printed circuit board wiring.

The additional soldering step required to connect the connector to the printed circuit board can be time consuming and costly in mass-production operations. Additionally, whenever such a soldered connector is replaced (i.e., in a repair operation), a further time consuming and costly de-soldering operation is also required. Therefore, it would be desireable to utilize a solderless connection capable of establishing a connection between the connector and the printed circuit.

SUMMARY OF THE INVENTION

It is an object of the present invention to provide a coaxial connector half or a high current connector which can be connected to the printed circuit without the necessity of performing soldering operations.

According to the principles of the invention, a connector body is provided with a conductor pin that extends from the connector body. The conductor pin is provided with a press-in zone for engaging the walls of a bore disposed in the printed circuit board. With the press-in zone engaging the walls of the bore, a solderless mechanical and electrical connection between the connector body and the printed circuit board is established.

In one of the preferred embodiments, the connector is a coaxial connector half. The coaxial connector half has a central conductor pin disposed coaxial with an outer housing. The outer housing has two contact bores disposed therein. A pair of peripheral conductor pins extend between the outer housing and the printed circuit board. A first nail-shaped region of each peripheral conductor pin engages the walls of the contact bores in the outer housing, and a board connection region of the conductor pins extend from the outer housing to the printed circuit board. The board connection region of each peripheral conductor pin has a press-in zone adapted to engage the walls of a printed circuit board bore thereby allowing the peripheral conductor pins to establish a solderless electrical and mechanical connection between the outer housing and the printed circuit board. Similarly, the central conductor pin is provided with a press-in zone that engages a corresponding printed circuit board bore.

In a further preferred embodiment, the connector is a high current contact having an electrically conductive body. A contact bore is disposed axially through the central portion of the body. The nail-shaped portion of a central conductor pin engages the walls of the contact bore. The board connection region of the central conductor pin proceeds from the conductive body and has a press-in zone which engages a corresponding bore in the printed circuit board to establish a solderless electrical and mechanical contact therebetween.

One aspect of the invention relates to the fact that each conductor pin may be manufactured as a separate body. The board connection region of the separate body has a press-in zone which electrically and mechanically engages the walls of a bore disposed in the printed circuit board. Opposite the board connection region of each conductor pin is a nail-shaped portion adapted to engage the walls of a bore disposed in a connector body. Between the nail-shaped portion and the press-in zone there is a flange-like widening of the pin with shoulders directed to the press-in zone. When the connector is a coaxial connector half, the shoulders make it possible to press the conductor pin into a correspondingly dimensioned bore in the inner conductor or the outer housing of the connector before the connector half itself is connected to the printed circuit board. Consequently, it is possible to manufacture the connector half and the conductor pins of the connector half respectively from materials that are particularly suitable for the corresponding part.

The central conductor of the coaxial connector half as well as the conductor pin of the high-current connector are formed to be relatively thick, as is already known in connection with contact springs or contact blades of multiple-contact-connectors. Consequently, it is possible to use only the central conductor or conductor pin to mechanically secure the connector in a solder-free fashion to the printed circuit board.

BRIEF DESCRIPTION OF THE DRAWINGS

Other objects, features, and advantages of the invention, will best be understood from the following detailed description, taken in conjunction with the accompanying drawings, on which.

DESCRIPTION OF THE PRESENTLY PREFERRED EMBODIMENTS

Figure 1:
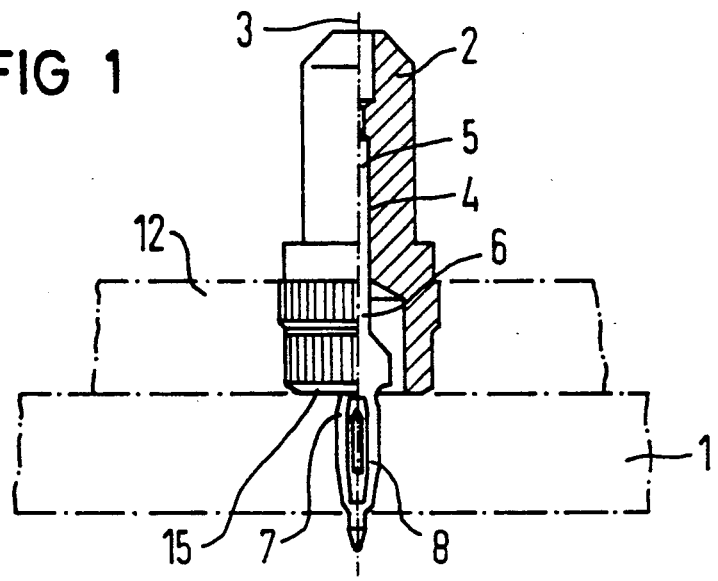
FIG. 1 is a half cross-sectional view of a high-current contact connected to a printed circuit board and constructed in accordance with the principles of the present invention.
Figure 4:
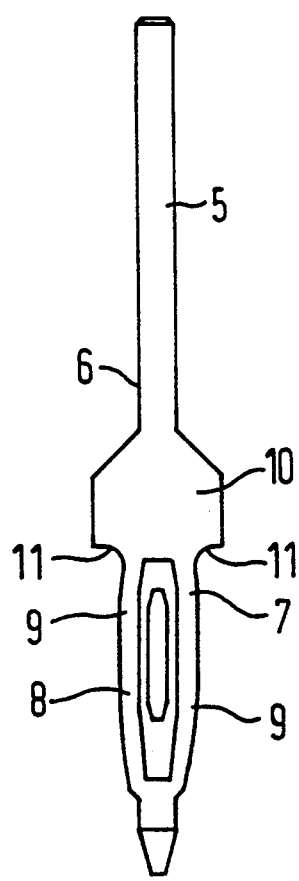
FIG. 4, is a perspective view of a separately manufactured conductor pin constructed in accordance with the principles of the present invention.

Shown in FIG. 1 is a high-current connector 2 provided for connection to a printed circuit board 1. The connector has a cylindrically fashioned metal body that has its axis 3 directed perpendicular to the printed circuit board 1. A concentric longitudinal bore 4 proceeds axially through the printed circuit board side 15 of the metal body of the connector. A nail-shaped pin section 5 of a separately manufactured conductor pin 6 (FIG. 4) is plugged into the longitudinal bore 4 and makes electrical and mechanical contact with the metallic body.

The conductor pin 6 has a board connection region 7 that projects out of the metallic body of the high-current connector 2 in the direction forwards the printed circuit board 1. The board connection region 7 is provided with a press-in zone 8. The press-in zone 8 is obtained by dividing the board connection region 7 into two arms 9 proceeding at a certain distance from each other. When the board connection region 7 is plugged into a correspondingly designed metallized bore in the printed circuit board 1, the arms 9 are pressed plastically and elastically against one another thereby securing the press-in zone 8 in the bore of the printed circuit board. The arms 9 press against the metallized wall of the bore to establish a good electrical contact between the conductor pin 6 and the metallized wall of the bore of the printed circuit board 1. This establishes an electrical connection between the metallic body and the printed circuit.

A flange-like section 10 is provided between the nail-shaped region 5 of the conductor pin 6 and the press-in zone 8 of the board connection region 7. Shoulders 11 of that section 10 are directed toward the press-in zone 8. The flange-like section 10 and the shoulders 11 are used to assist in pressing the nail-shaped region 5 of the conductor pin 6 into the boring 4 of the metallic body of the high current connector 2.

Additional mechanical fastening of the high-current connector to the printed circuit board 1 can be provided by integrating the connector into a block-shaped plastic body 12 which, in turn, can be mechanically connected with connecting means, such as elastic hooks (not shown), to the printed circuit board 1.

Figure 2:
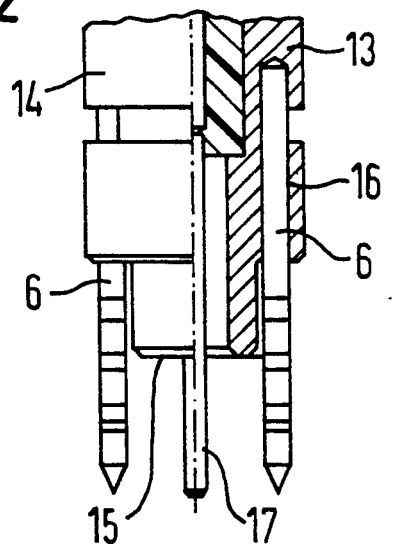
FIG. 2 is a half cross-sectional view of a coaxial connector half constructed in accordance with the principles of the present invention.
Figure 3:
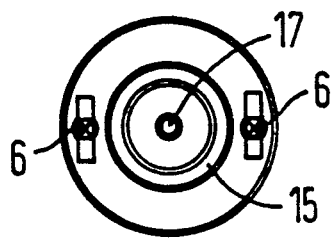
FIG. 3 is a bottom view of the coaxial connector half shown in FIG. 2.

A coaxial connector half 14 that is constructed in accordance with the principles of the invention is shown in FIGS. 2 and 3. The separately manufactured peripheral conductor pins 6 are used to electrically connect a substantially hollow and cylindrical metallic outer housing 13 of the coaxial connector half 14 to the printed circuit board wiring via bores in the printed circuit board. The outer housing 13 is provided with longitudinal bores 16 which are accessible from the printed circuit board end 15 of the connector half 14. The nail-shaped region 5 of each peripheral conductor pin 6 is plugged into one of the longitudinal bores 16. The peripheral conductor pins 6 and the bores 16 are dimensioned so that the peripheral conductor pins project out of the end 15 of the connector half 14. This allows the press-in zone 8 of each peripheral conductor pin 6 to enter a corresponding metallized bore disposed in the printed circuit board. As shown in FIGS. 2 and 3, the cylindrical metallic housing 13 has a narrower cylindrical projecting end part 20 at the end 15 of the connector half 14 which has a diameter which is less than an outermost peripheral diameter of the housing where the pins 6 are received in the bores 16.

The central inner conductor 17 is also fashioned to accept a conductor pin 6 or, alternatively, may be itself fashioned with a press-in zone. The central conductor of the coaxial connector half is formed to be relatively thick. Consequently, it is possible to secure the connector half 14 to the printed circuit board 1 using only the central conductor.

Although modifications and changes may be suggested by those skilled in the art, it is the intention of the inventor to embody within the patent warranted hereon all changes and modifications as reasonably and properly come within the scope of his contribution to the art.

We claim:

1. A coaxial plug connector half for connection to printed circuit board, comprising:
    a one-piece metallic outer conductor housing which is cylindrical and hollow and having an outer peripheral wall and a narrower cylindrical projecting end part at a circuit board end of the connector which has a diameter which is narrower than an outermost peripheral cylindrical surface of the outer peripheral wall;
    a central conductor pin arranged coaxially and insulated in the outer conductor housing;
    at least one peripheral terminal pin arranged within the outer conductor housing;
    the central conductor pin and the peripheral terminal pin each being pluggable into a respective allocated bore of the printed circuit board and provided with a press-in zone formed by splitting a region of the pin which is pluggable into the printed circuit board in the respective allocated bore; and
    the peripheral terminal pin having a section designed nail-like which faces away from the press-in zone, said nail-like section being plugged into a longitudinal bore within the outer peripheral wall of the one-piece outer conductor housing such that the peripheral terminal pin lies inwardly of said outermost peripheral cylindrical surface of the wall of the cylindrical one-piece housing and lies outwardly of and alongside the narrower cylindrical projecting end part.

2. A coaxial plug connector half according to claim 1 wherein two of said peripheral terminal pins are provided lying diametrically opposite one another in addition to the central contact pin, each of the pins being provided in respective longitudinal bores in the wall of the outer conductor housing.

3. A coaxial plug connector half according to claim 2 wherein the peripheral terminal pins are designed with shoulders between the nail-shaped sections and the press-in zones thereof, said shoulders pointing toward the press-in zone and having a flange-like broadened portion.

4. A coaxial plug connector half according to claim 2 wherein the central contact pin has a same shape as the peripheral terminal pins.

* * * * *